(12) United States Patent
Lo et al.

(10) Patent No.: US 7,531,383 B2
(45) Date of Patent: May 12, 2009

(54) ARRAY QUAD FLAT NO-LEAD PACKAGE AND METHOD OF FORMING SAME

(75) Inventors: Wai Yew Lo, Selangor (MY); Heng Keong Yip, Selangor Darul Ehsan (MY)

(73) Assignee: Freescale Semiconductor, Inc., Austin, TX (US)

( * ) Notice: Subject to any disclaimer, the term of this patent is extended or adjusted under 35 U.S.C. 154(b) by 274 days.

(21) Appl. No.: 11/554,920

(22) Filed: Oct. 31, 2006

(65) Prior Publication Data

US 2008/0099784 A1 May 1, 2008

(51) Int. Cl.
  *H01L 21/00* (2006.01)
(52) U.S. Cl. .............................. 438/109; 257/E23.023
(58) Field of Classification Search .............. 257/666, 257/686, 777, E23.023; 438/109, 123
See application file for complete search history.

(56) References Cited

U.S. PATENT DOCUMENTS

| 5,757,080 | A | 5/1998 | Sota |
| 6,316,822 | B1 | 11/2001 | Venkateshwaran et al. |
| 6,337,510 | B1 | 1/2002 | Chun-Jen et al. |
| 6,545,345 | B1 | 4/2003 | Glenn et al. |
| 6,603,072 | B1 | 8/2003 | Foster et al. |
| 6,690,089 | B2 | 2/2004 | Uchida |
| 6,781,243 | B1 | 8/2004 | Li et al. |
| 6,885,093 | B2 | 4/2005 | Lo et al. |
| 7,166,494 | B2 * | 1/2007 | Karnezos ..................... 438/108 |
| 7,247,934 | B2 * | 7/2007 | Pu ............... 257/686 |
| 2003/0207515 | A1 | 11/2003 | Tan et al. |
| 2004/0036157 | A1 | 2/2004 | Akram et al. |
| 2004/0065963 | A1 | 4/2004 | Karnezos |
| 2004/0089955 | A1 | 5/2004 | Zhou |
| 2004/0145039 | A1 | 7/2004 | Shim et al. |
| 2007/0170571 | A1 * | 7/2007 | Gerber et al. ................ 257/686 |
| 2007/0200207 | A1 * | 8/2007 | Ramos et al. ................ 257/666 |
| 2008/0048308 | A1 * | 2/2008 | Lam ........................... 257/686 |

* cited by examiner

*Primary Examiner*—Nathan W Ha
(74) *Attorney, Agent, or Firm*—Charles Bergere

(57) ABSTRACT

An array QFN package (10) includes a first semiconductor package (12) and a lead frame (14) having a plurality of leads (16). A first IC die (22) is attached on a first side to the first semiconductor package (12) and is electrically connected to the leads (16) of the lead frame (14). A mold compound (30) encapsulates the first IC die (22), a portion of the first semiconductor package (12) and a portion of the leads (16) such that a plurality of I/O terminals (32) on the semiconductor package (10) is exposed.

16 Claims, 3 Drawing Sheets

ARRAY QUAD FLAT NO-LEAD PACKAGE AND METHOD OF FORMING SAME

BACKGROUND OF THE INVENTION

The present invention relates to the packaging of integrated circuits (ICs) and more particularly to an array quad flat no-lead (QFN) package and a method of forming the array QFN package.

A conventional QFN package typically comprises an IC die attached and electrically connected to a lead frame. The IC die, the electrical connections and a portion of the lead frame are encapsulated by a mold compound, leaving a portion of the leads exposed. The exposed leads serve as input and output (IO) connections to the encapsulated IC die and are typically located along a periphery of the QFN package. Because QFN packages provide a number of advantages over other lead frame package configurations including, for example, shorter electrical paths and faster signal communication rates, QFN packages are widely used as low pin count solutions for power elements. A drawback, however, is that the number of I/O connections on such packages is limited. Increasing the number of I/O connections on a QFN package necessitates reducing lead pitches or spacing between adjacent leads. Unfortunately, the reduction of lead pitches increases the likelihood of cross-talk and signal interference, and complicates the manufacturing process. Thus, a need exists for an array QFN package and a simple and inexpensive method of forming such a package.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
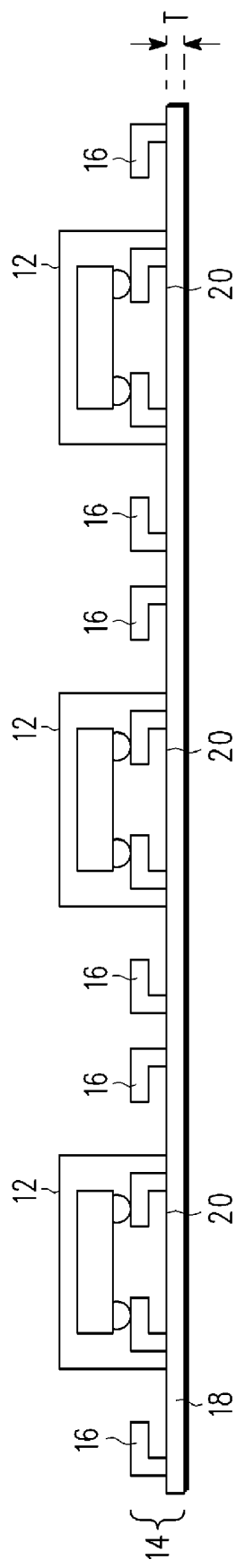
FIG. 1 is an enlarged cross-sectional view of a plurality of first semiconductor packages attached to a lead frame in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a semiconductor package including a first semiconductor package, and a lead frame having a plurality of leads. A first IC die is attached on a first side to the first semiconductor package and electrically connected to the leads of the lead frame. The first IC die, a portion of the first semiconductor package and a portion of the leads are encapsulated by a mold compound such that a plurality of input and output (IO) terminals on the semiconductor package is exposed.

The present invention also provides a method of forming a semiconductor package including the steps of attaching a first side of a first semiconductor package to a lead frame having a plurality of leads, and attaching a first IC die to a second side of the first semiconductor package. The first IC die is electrically connected to the leads of the lead frame. A molding operation is performed to encapsulate the first IC die, a portion of the first semiconductor package and a portion of the leads.

The present invention further provides a method of forming a plurality of semiconductor packages including the steps of attaching first sides of respective first semiconductor packages to a lead frame having a plurality of leads, and attaching a plurality of first IC dice to second sides of the respective first semiconductor packages. The first IC dice are electrically connected to the leads of the lead frame. A molding operation is performed to encapsulate the first IC dice, a portion of the first semiconductor packages and a portion of the leads.

A method of forming a plurality of array QFN packages 10 will now be described below with reference to FIGS. 1 through 4.

Referring now to FIG. 1, a plurality of inner or first semiconductor packages 12 is attached to a lead frame 14 as shown. The lead frame 14 includes a plurality of leads 16 attached to a carrier 18, the leads 16 defining a plurality of package receiving areas (not shown) on the lead frame 14. First sides 20 of the first semiconductor packages 12 are attached to the respective package receiving areas of the lead frame 14.

As shown in FIG. 1, the first semiconductor packages 12 of the present embodiment are flip chip QFN packages. Such packages are well known in the art and commercially available. Therefore, further description of these packages is not required for a complete understanding of the present invention. Nonetheless, it should be understood that the first semiconductor packages 12 of the present invention are not limited to flip chip or QFN packages. For example, the first semiconductor packages 12 may be wire bond packages, land grid array (LGA) packages or combinations of various package types in other embodiments. Further, the present invention can accommodate various package sizes, as will be understood by those of skill in the art. A typical example is a QFN having a size of about 5 millimeters (mm) by 5 mm. In one embodiment, the first semiconductor packages 12 are formed in a first pass process involving assembly, singulation and electrical testing. The first semiconductor packages 12 formed in the first pass process are then picked and placed onto the respective package receiving areas of the lead frame 14 for a second pass process to form the array QFN packages 10. Advantageously, because the first semiconductor packages 12 are fully assembled units, the first semiconductor packages 12 can be tested ahead of assembly to ensure that only electrically good units are incorporated into the array QFN packages 10. This increases the reliability of the array QFN packages 10 and the manufacturing yield.

The lead frame 14 may be formed by cutting, stamping or etching. In one embodiment, the leads 16 of the lead frame 14 are arranged such that they define an array of package receiving areas (e.g. a 3×6 array), each package receiving area having a size of about 5 mm by about 5 mm. However, it should be understood that the present invention is not limited to a particular process of forming the lead frame 14, by the layout of the package receiving areas on the lead frame 14, or by the dimensions of the package receiving areas. As will be understood by those of skill in the art, the dimensions of the package receiving areas are dependent on that of the corresponding first semiconductor packages 12, the dimensions of the package receiving areas being larger than that of the corresponding first semiconductor packages 12. In the present embodiment, the carrier 18 is a tape such as, for example, a mold masking tape. In one embodiment, the carrier 18 has a thickness T of about 0.03 mm. However, the present invention is not limited by the material from which the carrier 18 is made or the thickness of the carrier 18.

The first sides 20 of the first semiconductor packages 12 may be attached to the respective package receiving areas of the lead frame 14 in a known manner using existing eutectic attachment methods. For example, the first semiconductor packages 12 may be attached to the lead frame 14 using a die bond machine. To facilitate package attachment, the first sides 20 of the first semiconductor packages 12 are scrubbed (i.e. moved back and forth while pressure is applied) against the respective package receiving areas of the lead frame 14 during package attachment. In one embodiment, the first sides 20 of the first semiconductor packages 12 are scrubbed against the respective package receiving areas of the lead frame 14 at a temperature of about 40 degree Celsius (° C.) for approximately 3 seconds (s). However, the present invention is not limited by the stated process temperature and time as this may vary to obtain the optimized parameter settings.

Although FIG. 1 shows only three (3) first semiconductor packages 12 attached to the lead frame 14, it will be understood that fewer or more first semiconductor packages 12 may be attached to the lead frame 14, depending on the size of the lead frame 14 and the number of package receiving areas defined on the lead frame 14.

Figure 2:
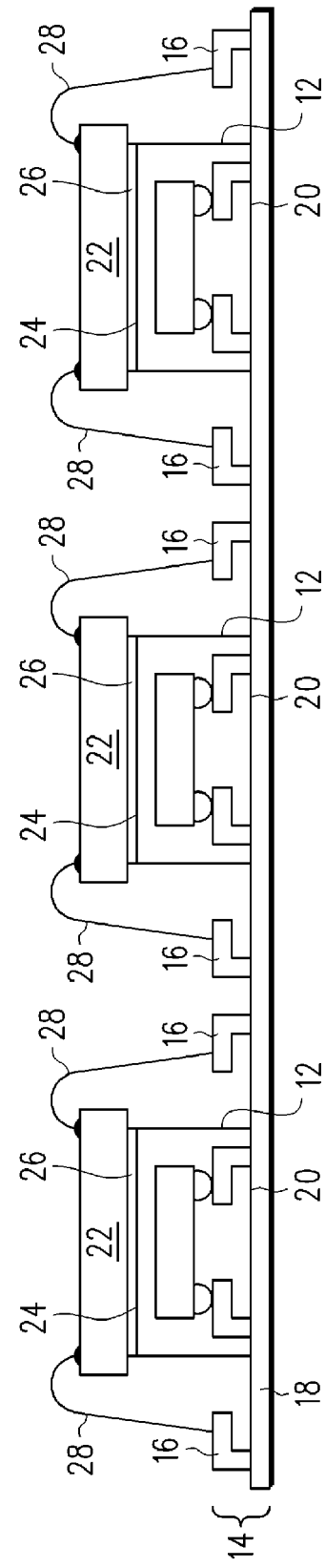
FIG. 2 is an enlarged cross-sectional view of a plurality of IC dice attached to respective ones of the first semiconductor packages and electrically connected to the lead frame of FIG. 1.

Referring now to FIG. 2, a plurality of IC dice 22 is attached to respective ones of the first semiconductor packages 12 and electrically connected to the leads 16 as shown. More particularly, the IC dice 22 are attached to second sides 24 of the respective first semiconductor packages 12 with an adhesive material 26, and electrically connected to the leads 16 of the lead frame 14 with a plurality of wire bonded wires 28.

The IC dice 22 may be processors, such as digital signal processors (DSPs), microcontrollers, special function circuits, such as memory address generators, or circuits that perform any other type of function. The IC dice 22 are not limited to a particular technology such as CMOS, or derived from any particular wafer technology. Further, the present invention can accommodate various die sizes, as will be understood by those of skill in the art. A typical example is a flash memory device having a size of about 6 mm by 6 mm.

In one embodiment, the adhesive material 26 is dispensed onto the second sides 24 of the first semiconductor packages 12 prior to placement of the IC dice 22 thereon. After die placement, the adhesive material 26 is cured through exposure and/or heating for a specified time period. When fully cured, the adhesive material 26 secures the IC dice 22 to the first semiconductor packages 12. The adhesive material 26 may comprise any of the typical adhesives used in die attachment processes, for example, epoxy, cyanate ester and polyimide. The adhesive material 26 may be deposited onto the second sides 24 of the first semiconductor packages 12 in a number of ways, such as with a needle and syringe or tape adhesive lamination.

The wire bonded wires 28 electrically connecting the IC dice 22 to the leads 16 of the lead frame 14 may be formed using a known wirebonding process such as, for example, ball bonding. The wire bonded wires 28 may be made of gold (Au) or silver or other electrically conductive materials as are known in the art and commercially available.

Although FIG. 2 shows only one (1) IC die 22 stacked on each of the first semiconductor packages 12, it will be understood that more than one IC die 22 may be stacked on each of the first semiconductor packages 12, depending on the required functionality of the resulting array QFN packages 10.

Figure 3:
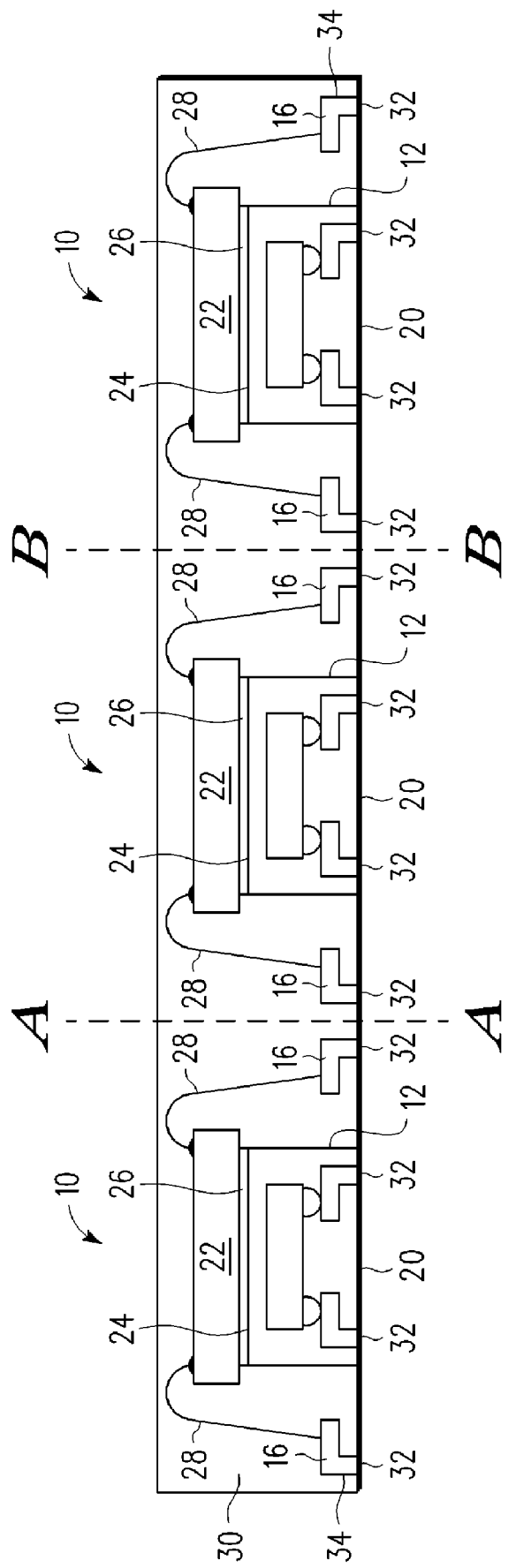
FIG. 3 is an enlarged cross-sectional view of a plurality of array QFN packages in accordance with an embodiment of the present invention.

FIG. 3 shows the IC dice 22 of FIG. 2 encapsulated with a mold compound 30 to form the array QFN packages 10. A molding operation such as, for example, an injection molding process is performed to encapsulate a portion of the first semiconductor packages 12, a portion of the leads 16 of the lead frame 14, the IC dice 22 and the wires 28. The mold compound 30 comprises well known commercially available molding materials such as plastic or epoxy.

After the molding operation is performed, the carrier or tape 18 is removed from the array QFN packages 10 to expose at least the bottom surfaces 32 of the leads 16 on the array QFN packages 10, which thereby form terminals. FIG. 3 shows the tape 18 already removed. The I/O terminals 32 provide connections to the first semiconductor packages 12 and the IC dice 22 stacked thereon. Adjacent ones of the array QFN packages 10 are separated along the vertical lines A-A and B-B by performing a singulating operation such as, for example, saw singulation to form individual array QFN packages 10. In this particular embodiment, the singulating operation is performed after removing the tape 18 from the array QFN packages 10. However, those of skill in the art will understand that the singulating operation can also be performed before removal of the tape 18. After the singulation operation, the outer side surfaces 34 of the outer row of leads 36 (see FIG. 4) may be exposed, if desired.

Figure 4:
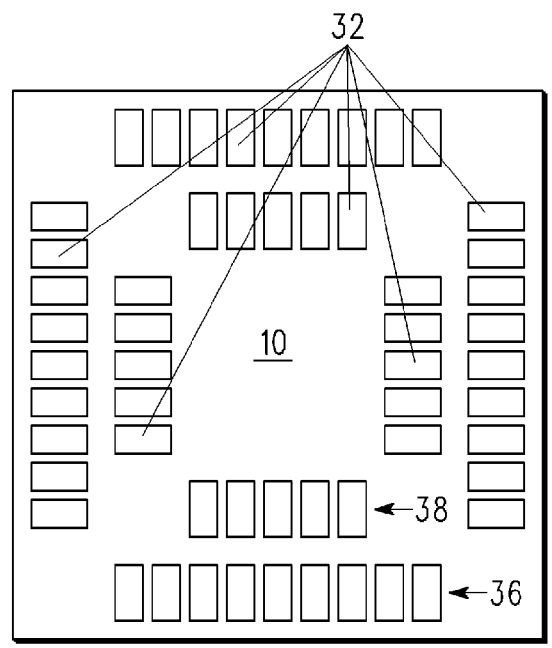
FIG. 4 is an enlarged bottom plan view of one of the array QFN packages of FIG. 3.

Referring now to FIG. 4, an enlarged bottom plan view of one of the array QFN packages 10 of FIG. 4 is shown. As shown in FIG. 4, the I/O terminals 32 define a first, outer row 36 and a second, inner row 38 of I/O terminals 32. Although in the embodiment shown in FIG. 4 the outer side surfaces 34 of the first outer row 36 of leads 16 are not exposed, it will be understood that such side surfaces 34 could be exposed. As can be seen, providing two rows of terminals allows a greater number of I/O connections to be provided on the array QFN package 10, without having to reduce the spacing between the leads 16. Consequently, the problems associated with lead pitch reduction can be avoided.

Figure 5:
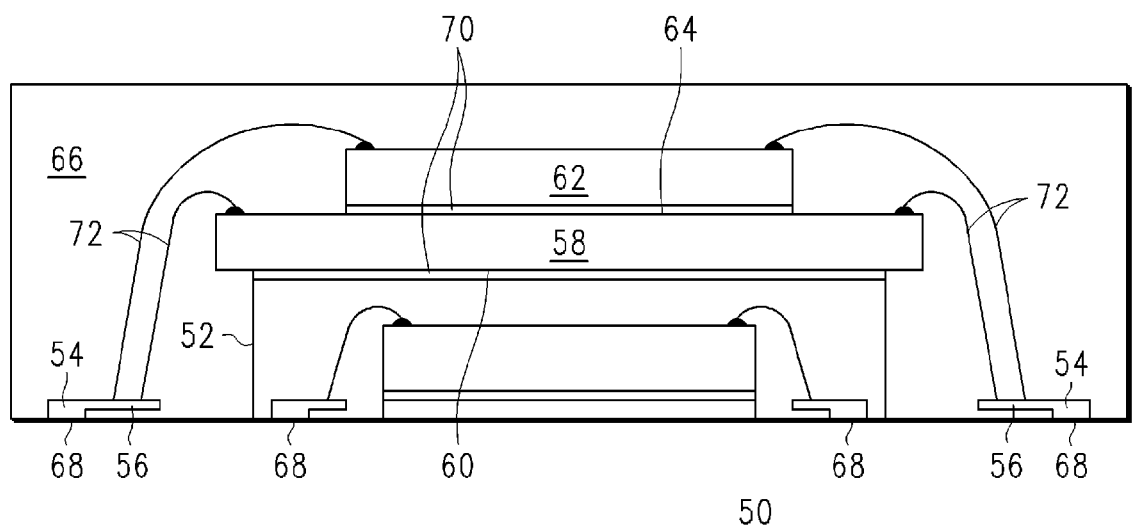
FIG. 5 is an enlarged cross-sectional view of an array QFN package in accordance with another embodiment of the present invention.

Referring now to FIG. 5, an enlarged cross-sectional view of an array QFN package 50 in accordance with another embodiment of the present invention is shown. The array QFN package 50 includes an inner or first semiconductor package 52 and a lead frame 54 having a plurality of leads 56. In this embodiment, the first semiconductor package 52 comprises a die electrically coupled to leads of a lead frame with wires and encapsulated with a mold compound. The first semiconductor package 52 is placed on a receiving area of a carrier tape (not shown). A first IC die 58 is attached on a first side 60 to the first semiconductor package 52, and a second IC die 62 is attached to a second side 64 of the first IC die 60. The first and second IC dice 58 and 62 are electrically connected to the leads 56 of the lead frame 54. A portion of the first semiconductor package 52, a portion of the leads 56, the first IC die 58 and the second IC die 62 are encapsulated by a mold compound 66 such that a plurality of terminals 68 on the array QFN package 50 is exposed.

As can be seen from FIG. 5, the first semiconductor package 52 of the present embodiment is a wire bond type QFN package. Such packages are well known in the art and commercially available. Therefore, further description of the first semiconductor package 52 is not required for a complete understanding of the present invention. However, as previously mentioned, it should be understood that the first semiconductor package 52 of the present invention is not limited to wire bond or QFN packages. For example, the first semiconductor package 52 may be an LGA package in other embodiments. Further, as previously described, the present invention can accommodate various package sizes, as will be understood by those of skill in the art. In one embodiment, the first semiconductor package 52 of the present invention is of a size of about 5 mm by 5 mm.

The first and second IC dice 58 and 62 may be processors, such as digital signal processors (DSPs), microcontrollers, special function circuits, such as memory address generators, or circuits that perform any other type of function. The first and second IC dice 58 and 62 are not limited to a particular technology such as CMOS, or derived from any particular wafer technology. Further, as previously mentioned, the present invention can accommodate various die sizes, as will be understood by those of skill in the art. For example, the first IC die 58 may be a flash memory device having a size of about 6 mm by 6 mm, and the second IC die 62 may be an ASIC device having a size of about 4 mm by 4 mm in one embodiment.

The first and second IC dice 58 and 62 may be respectively attached to the first semiconductor package 52 and the first IC die 58 with an adhesive material 70. The adhesive material 70 may comprise any of the typical adhesives used in die attachment processes such as, for example, epoxy, cyanate ester and polyimide.

As shown in FIG. 5, the first and second dice 58 and 62 are electrically connected to the leads 56 of the lead frame 54 via a plurality of wires 72. The wires 72 may be made of gold (Au) or other electrically conductive materials as are known in the art and commercially available and attached to the dice 58 and 62 and the leads 56 very commercially available wire bonding equipment.

The mold compound 66 encapsulating portions of the first semiconductor package 52 and the leads 56, the first and second IC dice 58 and 62, and the wire bonded wires 72 may comprise well known commercially available molding materials such as plastic or epoxy.

Although FIG. 5 shows two (2) IC dice 58 and 62 stacked on the first semiconductor package 52, it will be understood that fewer or more IC dice may be stacked on the first semiconductor package 52, depending on the required functionality of the resulting array QFN package 50.

As is evident from the foregoing discussion, the present invention provides an array QFN package and a simple and inexpensive method of forming such a package. Advantageously, a greater number of connections are provided on the array QFN package of the present invention without reducing the spacing between the leads, thus avoiding the problems associated with lead pitch reduction. Because a fully assembled unit is packaged within the array QFN package of the present invention, the inner semiconductor package can be tested ahead of assembly to ensure that only electrically good units are incorporated into the array QFN package of the present invention. This improves the reliability and manufacturing yield of the array QFN packages of the present invention. Further, by stacking one or more IC dice on the inner semiconductor package, greater functionality can be provided within a smaller footprint. Advantageously, because the present invention can be implemented using current semiconductor assembly equipment, there is no need for additional capital investment.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of forming a semiconductor package, the method comprising:
    attaching a first side of a first semiconductor package to a lead frame having a plurality of leads;
    attaching a first IC die to a second side of the first semiconductor package;
    electrically connecting the first IC die to the leads of the lead frame; and
    performing a molding operation to encapsulate the first IC die, a portion of the first semiconductor package and a portion of the leads.

2. The method of forming a semiconductor package of claim 1, further comprising attaching a second IC die to the first IC die and electrically connecting the second IC die to the leads of the lead frame.

3. The method of forming a semiconductor package of claim 2, wherein the second IC die is electrically connected to the leads of the lead frame via a plurality of wire bonded wires.

4. The method of forming a semiconductor package of claim 1, further comprising removing a tape from the semiconductor package to expose a plurality of I/O terminals on the semiconductor package.

5. The method of forming a semiconductor package of claim 1, wherein the step of attaching the first semiconductor package to the lead frame comprises scrubbing the first side of the first semiconductor package against a package receiving area of the lead frame.

6. The method of forming a semiconductor package of claim 1, wherein the first semiconductor package is one of a wire bond package and a flip chip package.

7. The method of forming a semiconductor package of claim 1, wherein the first IC die is electrically connected to the leads of the lead frame via a plurality of wire bonded wires.

8. The method of forming a semiconductor package of claim 1, wherein the first IC die is attached to the second side of the first semiconductor package with a die attach epoxy.

9. A method of forming a plurality of semiconductor packages, the method comprising:
    attaching first sides of respective first semiconductor packages to a lead frame having a plurality of leads;
    attaching a plurality of first IC dice to second sides of the respective first semiconductor packages;
    electrically connecting the first IC dice to the leads of the lead frame; and
    performing a molding operation to encapsulate the first IC dice, a portion of the first semiconductor packages and a portion of the leads.

10. The method of forming a plurality of semiconductor packages of claim 9, further comprising attaching a plurality of second IC dice to respective ones of the first IC dice and electrically connecting the second IC dice to the leads of the lead frame.

11. The method of forming a plurality of semiconductor packages of claim 10, wherein the second IC dice are electrically connected to the leads of the lead frame via a plurality of wire bonded wires.

12. The method of forming a plurality of semiconductor packages of claim 9, further comprising removing a tape from the semiconductor packages to expose a plurality of I/O terminals on the semiconductor packages.

13. The method of forming a plurality of semiconductor packages of claim 9, further comprising performing a singulating operation to separate adjacent ones of the semiconductor packages.

14. The method of forming a plurality of semiconductor packages of claim 9, wherein the step of attaching the first semiconductor packages to the lead frame comprises scrubbing the first sides of the first semiconductor packages against respective package receiving areas of the lead frame.

15. The method of forming a plurality of semiconductor packages of claim 9, wherein the first semiconductor packages is one or a combination of wire bond packages and flip chip packages.

16. The method of forming a plurality of semiconductor packages of claim 9, wherein the first IC dice are electrically connected to the leads of the lead frame via a plurality of wire bonded wires.

* * * * *